(12) United States Patent
Berezin

(10) Patent No.: US 6,448,912 B1
(45) Date of Patent: Sep. 10, 2002

(54) OVERSAMPLED CENTROID A TO D CONVERTER

(75) Inventor: Vladimir Berezin, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/430,625

(22) Filed: Oct. 29, 1999

Related U.S. Application Data

(60) Provisional application No. 60/106,490, filed on Oct. 29, 1998.

(51) Int. Cl.⁷ .................................................. H03M 1/20
(52) U.S. Cl. ....................................... 341/131; 341/143
(58) Field of Search .................................. 341/143, 141, 341/162, 172, 131, 155

(56) References Cited

U.S. PATENT DOCUMENTS

| | | | | | |
|---|---|---|---|---|---|
| 5,010,347 | A | * | 4/1991 | Yukawa | 341/143 |
| 5,124,706 | A | * | 6/1992 | Gerdes | 341/156 |
| 5,477,345 | A | * | 12/1995 | Tse | 358/500 |
| 5,659,315 | A | * | 8/1997 | Mandi | 341/143 |
| 5,717,618 | A | * | 2/1998 | Menkhoff et al. | 708/313 |
| 5,796,869 | A | * | 8/1998 | Tsuji et al. | 382/203 |

* cited by examiner

*Primary Examiner*—Peguy JeanPierre
*Assistant Examiner*—Jean Bruner Jeanglaude
(74) *Attorney, Agent, or Firm*—Fish & Richardson P.C.

(57) ABSTRACT

An oversampling A to D converter device. A succesive approximation A to D converter system is used with a relatively small size, and low resolution succesive approximation A to D converter. This converter is operated at a higher speed to obtain multiple samples and obtain additional bits of resolution from said multiple samples. Another aspect adds noise to the circuit, to cancel out noise.

13 Claims, 2 Drawing Sheets

OVERSAMPLED CENTROID A TO D CONVERTER

CROSS REFERENCE TO RELATED APPLICATIONS

This application claims the benefit of the U.S. Provisional Application No. 60/106,490, filed on Oct. 29, 1998.

BACKGROUND

An active pixel sensor typically takes the form shown in FIG. 1. A photosensor array 101 is disposed on a single chip substrate 100 with a number of columns 102 and rows 104. Each pixel has a photoreceptor 122, a follower transistor 124, and a selection transistor 126.

The pixels from the photosensor are coupled to one or more analog to digital converters 110 which convert the analog information 106 from the sensor 100 into digital output information 112. The analog to digital converters 110 are typically on the same substrate 100 with the image sensor 100. In a particularly preferred architecture, as shown, one analog to digital converter is associated with each column of the array. This system operates in column-parallel mode. At each clock cycle, an entire row of information is simultaneously output from the bank of analog to digital converters. The accuracy of the output image, which is collectively obtained from the output of all the analog to digital converters, is therefore dependent on the accuracy of the analog to digital converters. These devices, however, are limited in size. They must fit on the substrate. They also need to be relatively fast to maintain the processing speed.

SUMMARY OF THE INVENTION

The present invention teaches a system of introducing statistical processing into the A/D converters in order to improve the overall image quality. This is done according to the present invention by using A/D converters that are configured to oversample the input signal, find a centroid of the oversampled signal, and use the oversampling to enhance the accuracy.

The ADCs can operate with fewer bits than required for the total output, since oversampling is carried out.

BRIEF DESCRIPTION OF THE DRAWINGS

These and other aspects of the invention will be described in detail with reference to the accompanying drawings, wherein.

DESCRIPTION OF THE PREFERRED EMBODIMENTS

Figure 1:
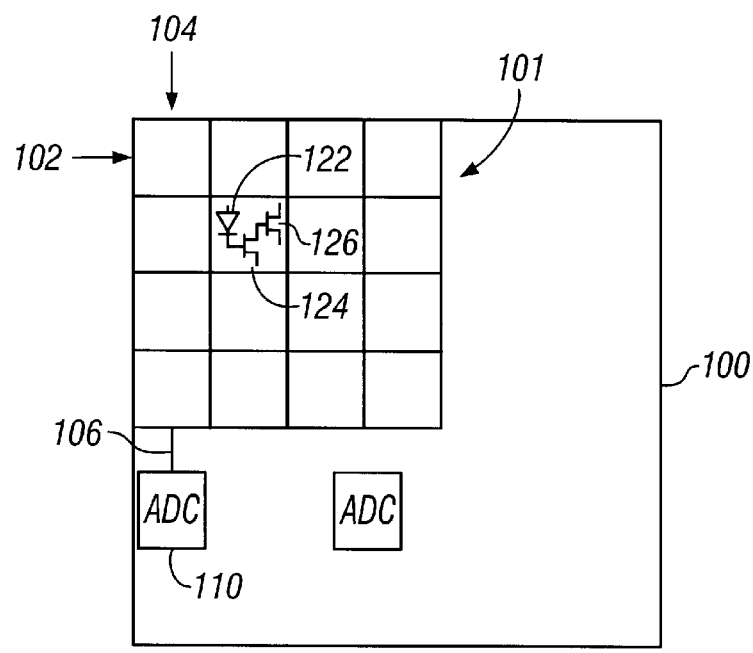
FIG. 1 shows an active pixel sensor block diagram.
Figure 2:
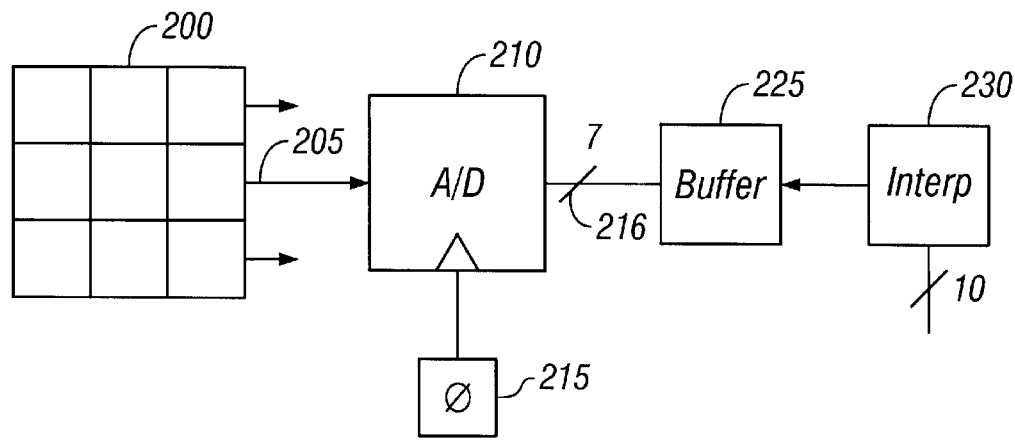
FIG. 2 shows a block diagram of the oversampling operation.

An embodiment is shown in FIG. 2. A photosensor array 200 can be for example, an active pixel sensor of the type described above and as described in U.S. Pat. No. 5,471,515, and shown in FIG. 1. The sensor is arranged to produce output signals 205. One output signal can be produced at any one time using a fast A to D converter, such as a flash type ADC, or output signals can be produced in a column-parallel manner.

Each output signal such as 205 is coupled to an A to D converter 210. The A to D converter 210 has a specified resolution, e.g. a resolution less than that desired for the total output.

In this embodiment, A to D converter 210 has a resolution of 7 bits shown as the output 216. The A to D converter is driven by a clock 215 which operates at frequency faster than the production of signal 205. For example, the clock may operate 16 times faster or 64 times faster than the speed at which the output signal 205 is produced. Therefore, each output signal, for example, is oversampled by 16 times or 64 times.

The results are stored in buffer 225, operated on by interpolator 230. Interpolator effectively averages the values in the buffer 225 so that the noise that is mixed with the signal is effectively averaged out. The averaged signal therefore has improved accuracy.

Moreover, since the number of bits needed for actual accuracy of the A/D converter is reduced, the A/D converter 210 can be made smaller and faster. According to a preferred embodiment, a 16 times oversampling is used to obtain three extra bits of image quality. In addition, image quality is increased by lower quantization distortion, and lower quantizing distortion. Dithering can also be used to improve the contouring.

An embodiment can use a 7 bit A/D converter, which is driven by the clock to oversample by sixteen times (16×).

The interpolator 230 is a standard digital interpolator as known in sigma delta A/D converters, for example. The 16 times oversample is interpolated to produce a 10-bit output at 235. An important advantage is that since the A/D converter 210 operates with fewer bits, it can be a successive approximation A/D converter which can operate with smaller capacitors. By using smaller capacitors, the amount of real estate on the chip substrate is decreased. In addition, the smaller capacitors take less time to charge. Since less space is taken up by the A to D converter, the ratio of the digital area to the analog area of the chip is increased. This helps to make the overall design more scalable to smaller CMOS features.

Figure 3:
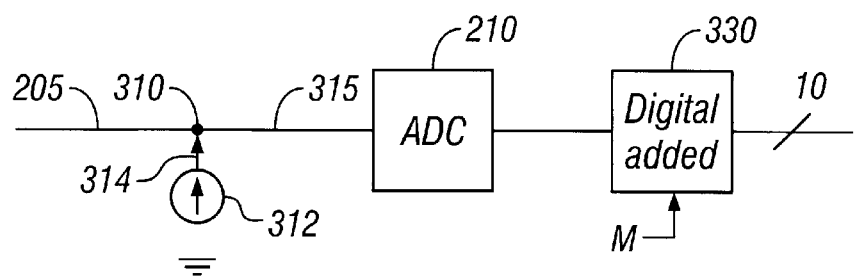
FIG. 3 shows a block diagram of another system using random noise addition.

Another embodiment is shown in FIG. 3. The analog signal 205 is connected to an analog adder 310 (e.g., a node) where it is added to noise produced by noise generator 312. The bias signal 314 applied to the adder 310 can be a representation of the noise in the system, to cancel out some of that noise. The level-adjusted analog signal 315 is then coupled to 7 bit A to D converter 210, which has a least significant bit resolution of 8 millivolts.

The output signal is coupled to a digital adder 330 which adds the output sample to previous samples. M samples are added, where here M can equal 16. The digital adder produces a digital output of N=10 bits, with the least significant bit (LSB)=1 millivolt.

This bias input 312 can be a bias level, or can be random noise with an RMS equal to half the value of the least significant bit.

The present system has described M=16 in order to obtain three additional bits of resolution. More generally, the number of required summations may be obtained from the equation for desired Dynamic Range Extension:

$$D = \log_2(2 \cdot \sqrt{M}) = 1 + 0.5 \cdot \log_2 M$$

The most reasonable selection for the standard TV application could be 3-bits, requiring 16 summations.

Other possible values are:

| M | D, bit |
|---|---|
| 8 | 2.5 |
| 16 | 3 |
| 32 | 3.5 |
| 64 | 4 |

Figure 4A:
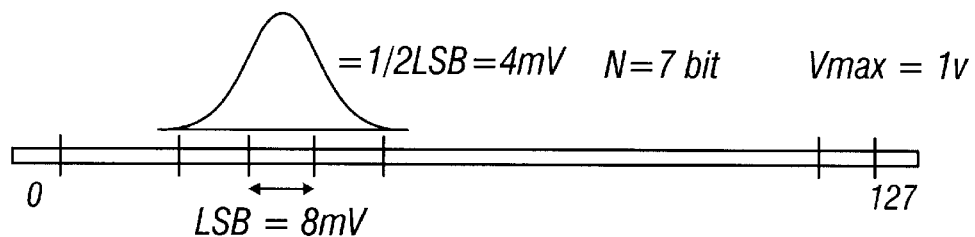
FIGS. 4a–4c illustrate the operation.
Figure 4B:
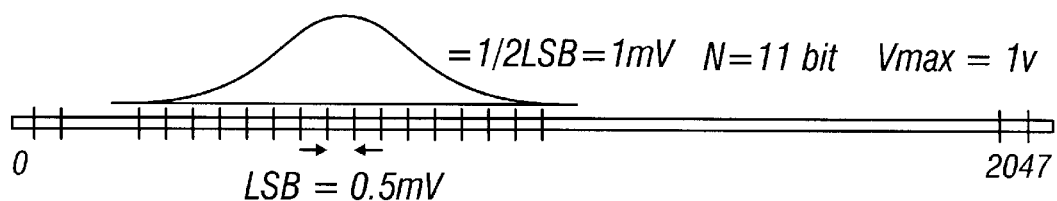
Figure 4C:
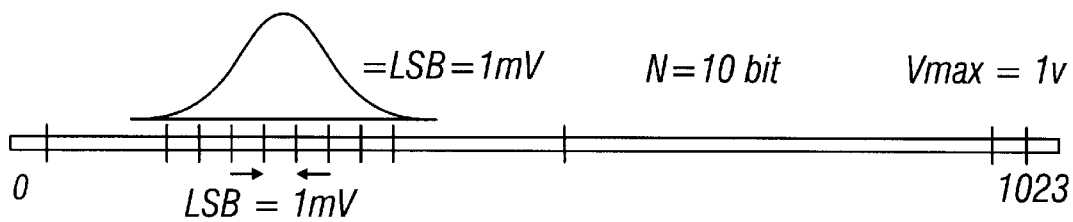

FIGS. 4A–4C show the operation of the oversampling centroid A to D converter. FIG. 4A shows the initial distribution, where the half LSB equals 4 millivolts. After 16 summations, the least significant bit is one millivolt, but the values have changed, as shown in FIG. 4B. FIG. 4C shows shifting right by one bit to produce the final output.

Quantizing distortion is often visible as contouring. The quantizing distortion is often countered by a technique called dither. Dither adds white noise to the signal. However, this dither reduces the signal to noise ratio.

Other embodiments are within the disclosed embodiment.

What is claimed is:

1. A method of sampling a image signal, comprising:
   obtaining an analog value indicative of an image signal;
   converting said analog value to a digital value at a first resolution;
   repeatedly converting said analog value to digital values at least a plurality of times; and
   using a plurality of results from said plurality of times to produce a signal that has more resolution than said desired resolution;
   adding a noise signal to said analog value to remove at least some noise and to produce an output signal with at least some noise removed by said adding.

2. A method as in claim 1 wherein said producing is via oversampling.

3. A method as in claim 1 wherein said producing is via a digital interpolator.

4. A method as in claim 1, wherein said using comprises adding all of the digital values.

5. A method as in claim 1, wherein said first resolution is 7 bits and said more resolution is 10 bits.

6. A method as in claim 1, further comprising obtaining a measure of the noise signal in the analog to digital converter, and wherein said noise signal that is added corresponds to said measure.

7. An oversampling A to D converter, comprising:
   a succesive approximation A to D converter, receiving a signal indicative of an image part, and converting said signal to digital with a first specified number of bits of resolution;
   a buffer, storing said digital signal;
   a noise generatic part, wich adds noise; and
   an element that oversamples said signal to increase said resolution and average out at least some of said noise.

8. A converter as in claim 7, wherein said first specified number of bits is 7 bits or less, and said increase comprises increasing said resolution by at least 2 bits.

9. A converter as in claim 8, wherein said element that oversamples includes a part that finds a centroid of a plurality of different samples.

10. A converter as in claim 7, further comprising a bias generator, and an adding element, and adding an output of said bias generator to decrease a noise in an output signal.

11. A converter as in claim 10, wherein said bias generator produces an output signal that corresponds to a measure of noise in the system.

12. A converter as in claim 10, wherein said adding element is a node.

13. A converter as in claim 10, wherein said bias generator is a random noise generator.

* * * * *

UNITED STATES PATENT AND TRADEMARK OFFICE
CERTIFICATE OF CORRECTION

PATENT NO. : 6,448,912 B1
DATED : September 10, 2002
INVENTOR(S) : Vladimir Berezin It is certified that error appears in the above-identified patent and that said Letters Patent is hereby corrected as shown below:

<u>Title page,</u>
Item [57], ABSTRACT,
Lines 1 and 3, change "succesive" to -- successive --;
Line 5, change "and obtain" to -- and to obtain --.

Signed and Sealed this

Eighth Day of April, 2003

JAMES E. ROGAN
*Director of the United States Patent and Trademark Office*